United States Patent [19]
Neff

[11] 3,973,682
[45] Aug. 10, 1976

[54] PICK UP ASSEMBLY FOR FRAGILE DEVICES

[75] Inventor: Dieter Klaus Neff, Cambridge, Vt.

[73] Assignee: International Business Machines Corporation, Armonk, N.Y.

[22] Filed: Dec. 20, 1974

[21] Appl. No.: 534,935

[52] U.S. Cl. .................................. 214/1 BT; 91/52
[51] Int. Cl.² ......................................... B65B 69/00
[58] Field of Search ............ 214/1 BB, 1 BH, 1 BT; 91/47, 50, 51, 52

[56] References Cited
UNITED STATES PATENTS

| | | |
|---|---|---|
| 2,932,281 | 4/1960 | Moskowitz ............................. 91/52 |
| 3,785,507 | 1/1974 | Wiesler et al. .................... 214/1 BH |
| 3,870,164 | 3/1975 | Haase .............................. 214/1 BB |

*Primary Examiner*—Robert G. Sheridan
*Attorney, Agent, or Firm*—Francis J. Thornton

[57] ABSTRACT

A sensitive low contact mass pick up assembly for picking up fragile devices is disclosed. The pick up assembly is fluid actuated and comprises a contact element which moves toward the device to be picked up with a controlled motion and which is provided with a controlled deacceleration such that the motion of the element becomes substantially zero as the element approaches the device to be picked up and the impact on the device is significantly reduced.

15 Claims, 7 Drawing Figures

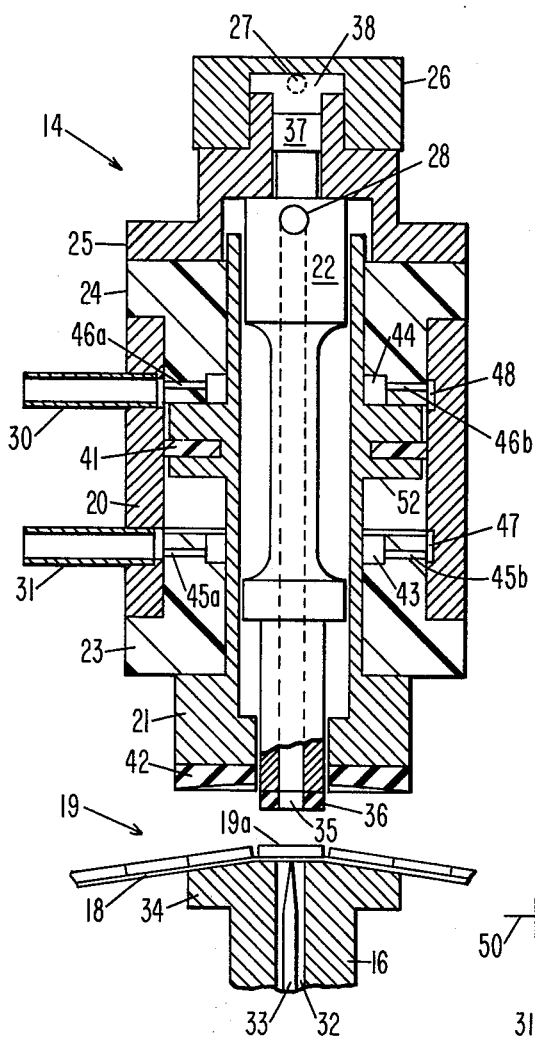
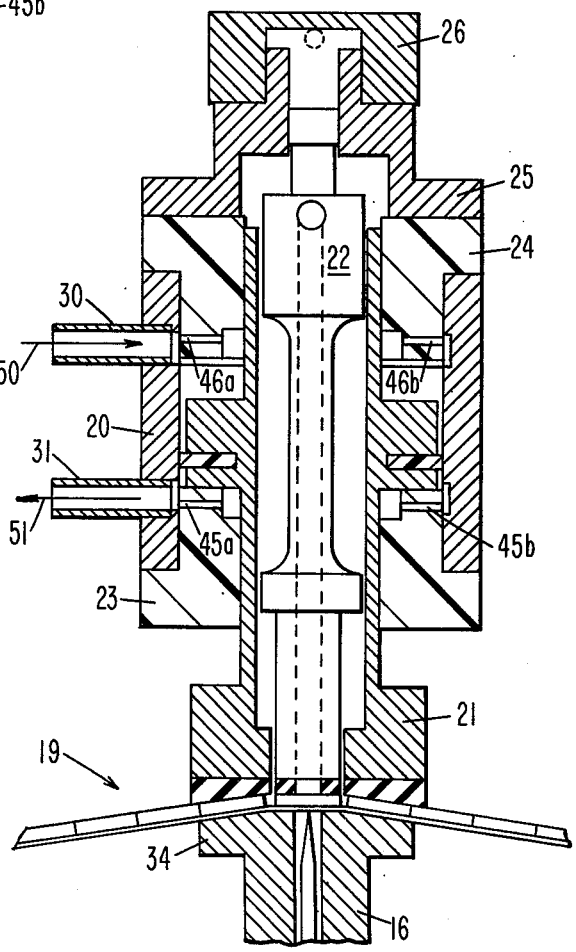
FIG. 3
FIG. 4

PICK UP ASSEMBLY FOR FRAGILE DEVICES

BACKGROUND OF THE INVENTION

1. Field of the Invention

This invention relates generally to the handling of fragile devices such a semiconductor dice and more particularly to a pick up pencil assembly which has low contact mass and controlled deacceleration.

2. Description of the Prior Art

Apparatus for the selection and sorting of semiconductor chips is known. U.S. Pat. No. 3,720,309 discloses on such apparatus. This patent shows a wafer of semiconductor material fractured into individual chips mounted on an adhesive tape and positioned over a needle housing which contains an extendable needle. The needle housing is surrounded by a vacuum collar for holding down the chips surrounding the chip to be selected. The needle, as it extends out of the housing, ruptures the tape and pushes the selected chip off the tape and against a probe rigidly held a fixed distance above the needle housing.

Because the chip must traverse this fixed distance from the housing to the probe on the point of the needle, slipage or twisting or canting of the chip can easily occur with resulting adverse effects to the chip such as smearing of the contacts on the face of the chip or even breakage of the chip. Also uneven rupture of the tape can cause the contact force of the chip with the probe to vary considerably also resulting in damage to the chip. Additionally as the chips are removed from the tape the holes in the tape made by the needle reduces the effect of the vacuum collar which in turn permits still further shifting and twisting of the chips.

SUMMARY OF THE INVENTION

The present invention avoids all such difficulties and eliminates the problems of twisting or canting or slipage of the chip being selected. The pick up assembly of the present invention accomplishes this by providing a contact element, comprising a hold down cylinder containing a pick up pencil, with a controlled deacceleration. The present invention is designed as that the pencil first comes into contact with the chip to be picked up and the hold down cylinder positively clamps the surrounding chips in a fixed position against a needle housing before having an extendable needle contained in the housing comes into contact with the selected chip. Because the pencil contacts the chip before the needle is activated the needle lifts both the chip and the low contact mass pencil away from the adhesive backing on which the chip is mounted. The pencil is particularly designed to have a minimum mass thus requiring minimum effort by the needle to lift it and the chip. Further the contact element is designed with a controlled deacceleration such that shock to the chip being picked up is minimized.

It is, therefore, an object of the present invention to provide a novel pencil pick up assembly in which the contact element is provided with a controlled deacceleration so as to minimize shock to the chip being picked up.

It is a further object of the invention to provide a low contact mass sensitive pick up pencil in which the impact of the pencil on the device is minimal.

It is still a further object of the invention to provide a contact element in which the chips surrounding the chip to be picked out of the wafer is positively held prior to the chip to be selected being moved.

These and further objects of the present invention can be more fully appreciated from the accompanying drawings in which:

DESCRIPTION OF THE DRAWINGS

FIG. 3 shows a cut away section of the apparatus shown in FIG. 2.

FIG. 4 shows a cross-sectional view similar to that of FIG. 3 with the contact element contacting the chips.

DESCRIPTION OF THE PREFERRED EMBODIMENT

Figure 1:
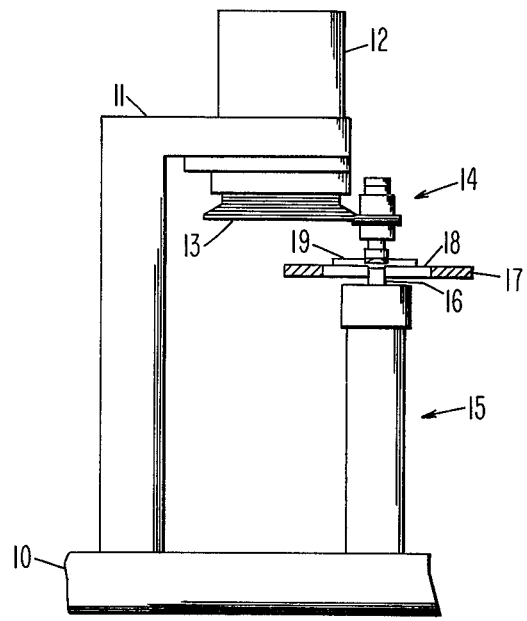
FIG. 1 shows an overall view of the novel pencil assembly and needle housing.

With reference now to the figures and especially to FIG. 1 there is shown mounted on a base 10 a motor support 11 carrying a stepping motor 12 which is adapted to drive, in rotary fashion a spider 13 which has located thereon a pencil assembly 14. Located below the pencil assembly 14 and also supported on the base 10 is a needle assembly 15 having a needle housing 16 extending therefrom. Maintained between the pencil assembly 14 and the needle housing 16 is a wafer carrier 17. This wafer carrier 17 comprises a hollow ring of aluminum having a Teflon adhesive tape 18 stretched thereon. A wafer 19 is mounted on the tape 18. Prior to the positioning of the wafer carrier 17 between the pencil assembly 14 and the needle housing 16 the wafer has been scored and fractured into a plurality of individual dice by techniques well known to the art.

Figure 2:
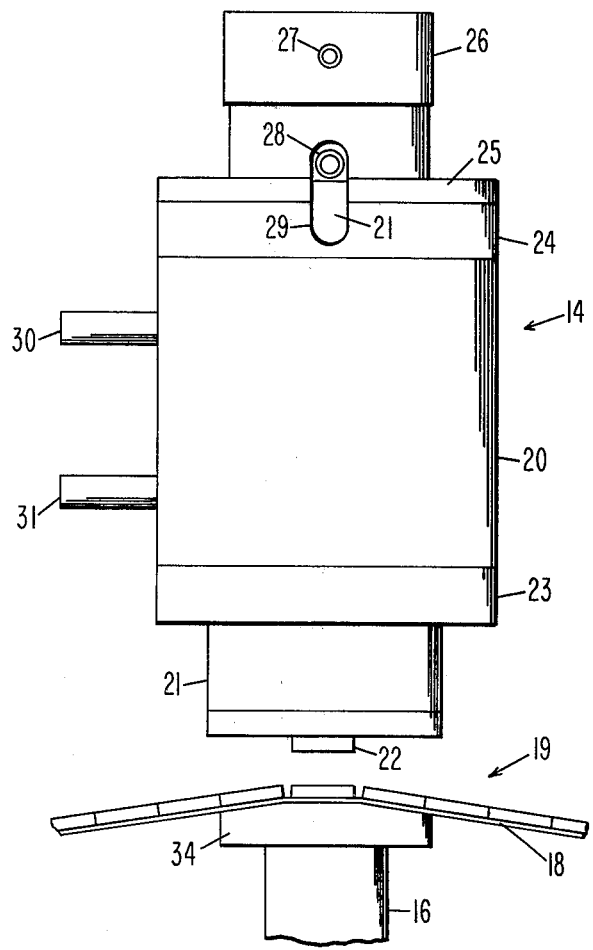
FIG. 2 shows a greatly enlarged view of the pencil pick up assembly and the needle housing.

The pencil assembly 14 is shown in greater detail in FIG. 2. This FIG. 2 also depicts the upper portion of the needle housing 16, and a portion of the tape 18 and the fractured wafer 19. The pencil assembly 14 comprises a housing 20 surrounding a hollow hold down cylinder 21 which in turn contains a generally concentric cylinder piston 22. The lower end of the housing 20 is sealed with a lower bearing 23 and at its upper end with an upper bearing 24. Supported on the upper bearing 24 is a bearing housing 25 capped by a manifold 26. This manifold 26 is provided with a port 27 leading to its interior. The piston 22 is preferably formed of a light weight material such as aluminum and provided with a tube which extends from the interior of piston 22. This tube 28 is positioned in a slot 29 and bears against the upper edge of the hold down cylinder 21. The housing 20 is further provided with an upper port 30 and a lower port 31.

FIGS. 3, 4, 5, and 6 are sectional details of the pencil assembly and the upper part of the needle housing shown in FIG. 2 and illustrates different operating positions of the pencil and needle.

Figure 7:
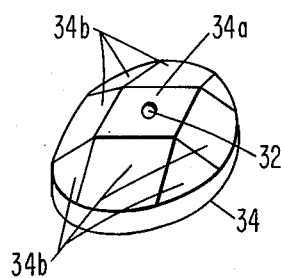
FIG. 7 shows the slope of the needle housing head.

As illustrated in FIGS. 3, 4, 5, and 6 the needle housing 16 has a central orifice 32 containing a needle 33 which is slidable in the orifice 32. The needle housing 16 is further provided with a head 34 in the form of a truncated pyramid having an orthogonal base as shown in FIG. 7, that supports the chip immediately adjacent the chips being selected. The needle 33 is spring mounted against a cam (not shown) which is driven by a motor (not shown) such that the needle 33 can be extended out of the needle housing 16 as will be later described.

As more fully illustrated in FIG. 3 the piston 22 is provided with a central orifice 35. This orifice 35 connects with a tube 28 and extends through a rubber cushion 36 provided on the lower end of piston 22. The piston 22 is centrally maintained in the hold down cylinder 21 by a slidable bearing 37 which fits in a suitably centered cavity 38 provided in the bearing housing 25. A port 27 which extends through the manifold 26 interconnects this cavity 38 to the outside of manifold 26.

The piston 22 is positioned within the center of the hollow hold down cylinder 21 which is positioned so as to slide in the bearings 23 and 24. The cylinder is bisected by a central seal bearing 41 and terminated with a rubber face mat 42 which is contoured to mate with the anvil or needle housing head 34. Both the lower bearing 23 and the upper bearing 24 are secured to the housing 20 by a plurality of screws (not shown) the screws holding the upper bearing 24 to the housing 20 also secure the bearing housing 25 to the housing 20 while the manifold 26 is pressed on to the bearing housing 25.

Both the lower bearing 23 and the upper bearing 24 and the seal bearing 41 are preferably made of a low friction material such as a fluorocarbon such that the cylinder 21 will easily slide in the bearings. Each of these bearings 23 and 24 is provided with respective recesses 43 and 44 which are adjacent to the ring and the hold down cylinder 21. Each of these recesses 43 and 44 are provided with opposed ports 45a and 45b and 46a and 46b respectively which are located on a diameter of the bearings. These opposed ports communicate with the respective ring grooves 47 and 48 provided in the internal wall of the housing 20. The ports 30 and 31 are located on the grooves 47 and 48 respectively.

The operation of the apparatus is best illustrated by the sequence of steps illustrated in FIGS. 3 through 6. Initially air pressure is introduced, via the port 27 into cavity 38 to apply a constant force to the slidable bearing 37 and hence piston 22. Simultaneously a 7 psi compressed air flow is coupled into port 28 to cause air to flow out of the orifice 35 is piston 22 across the face of the chip 19a positioned directly below the piston. This air flow will blow away any loose debris that may be on the face of the chip 19a. While this air is flowing out of orifice 35, 30 psi of air pressure is introduced into port 30 as indicated in FIG. 4 by arrow 50. This air flows down through the recessed groove 48 and channels 46a and 46b into the recess 44 causing the hold down cylinder 21 to be driven toward the fractured wafer 19 supported on the needle housing head 34. As the hold down cylinder 21 moves downward the air beneath it is forced out of port 31 as indicated by arrow 51. The pressure applied through the upper port 30 cannot reach the lower port 31 because of the central seal bearing 41 positioned around the center of the hold down cylinder 21. As the lower surface 52 of this hold down cylinder 21 approaches the lower bearing 23 the air becomes compressed in the recess 43 and is forced out through the channels 45 and 45a and the groove 47 to the port 31. Because the channels 45a and 45b constricts the air flow from recess 43 a controlled deacceleration force is applied to the hold down cylinder 21 to cause the motion of the hold down cylinder toward the wafer 19 to be reduced substantially just as the hold down cylinder comes in contact with the wafer 19. Because the piston 22 is positively maintained against the upper edge of the hold down cylinder by the contant pressure applied through port 27, the piston 22 also comes down and contacts the chip 19a located directly below the piston. Approximately 2 milliseconds after the air pulse has been applied through port 30 to force the hold down cylinder 21 against the fractured wafer 19, the air flow through orifice 35 is terminated and a vacuum applied to draw and hold the chip 19a against the pad 36 provided on the bottom of the piston 22. Approximately 50 milliseconds later the needle 33 is driven up through the adhesive tape 18 against the under side of the chip 19a.

Figure 5:
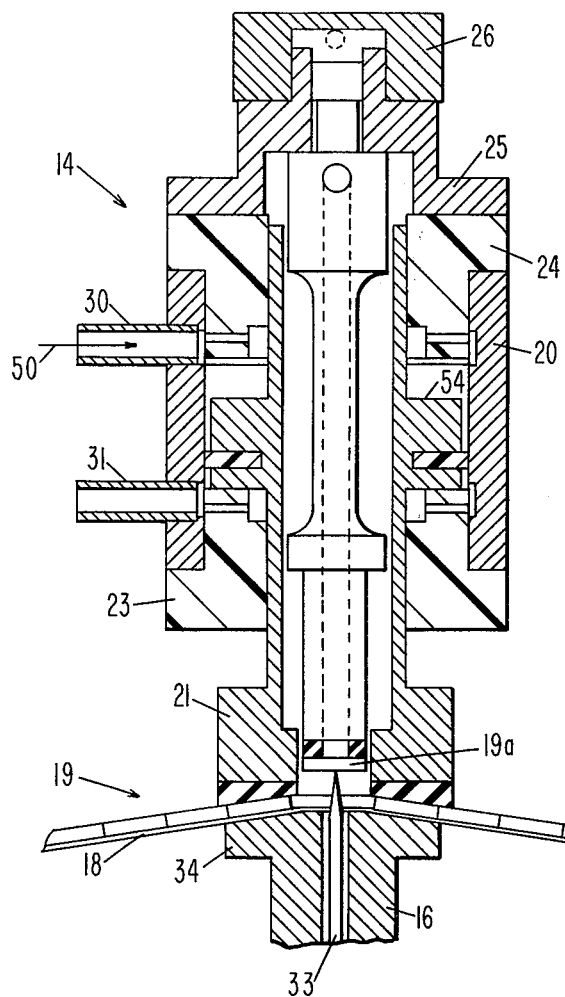
FIG. 5 shows a cross-sectional view of the apparatus FIG. 2 with the chip removed from the tape by the needle.

The action of the hold down cylinder 21 positively secures all the devices surrounding the device 19a and prevents them from moving as the needle 33 penetrates the adhesive and forces the chip 19a and the piston 22 up against the constant pressure maintained in cavity 38. This positive hold down action by the hold down cylinder avoids the possibility of adjacent chips riding up, shifting, or twisting in position and prevents distortion of the location of these chips. It also prevents damage to the edge of the chips caused by the action of the needle rupturing the adhesive tape 18 and forcing the chip 19a against the bottom of the piston 22. As the needle 33 penetrates the adhesive tape 18 and forces the chip 19a against the bottom of the piston 22 it lifts the chip 19a and the piston 22 against the pressure in cavity 38 and drive them upward into the center of the hold down cylinder 21 as illustrated in FIG. 5.

Because of the constant force applied by the air pressure to the piston 22, through the manifold port 27, the piston force together with the vacuum applied through port 28 keeps the chip 19a square on the needle point and prevents the chip 19a from turning or twisting. In this way smearing of the small soft solder balls on the face of such chips is eliminated.

Figure 6:
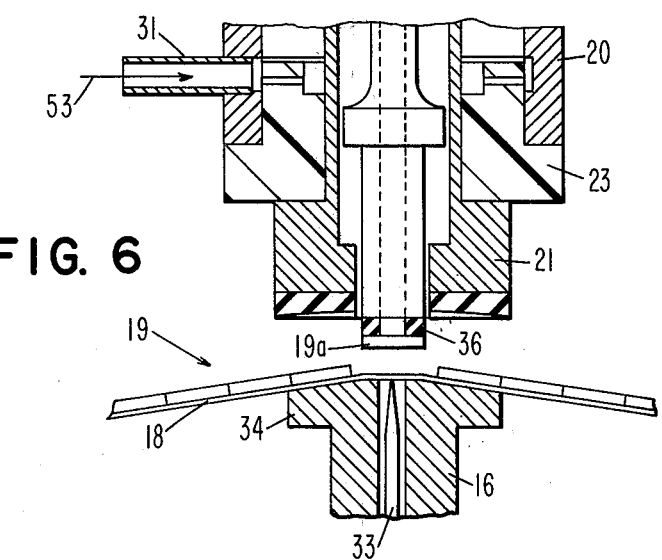
FIG. 6 shows a partial cross-sectional view of the apparatus with the chip being held by the contact element.

After the piston 22 has been forced up into the center of the hold down cylinder, the pressure applied through port 30 to maintain the hold down cylinder 21 against the fractured wafer 19 is released. Directly an air pressure of 30 psi is applied to the lower port 31 as indicated in FIG. 6 by arrow 53. This air passes through the communication channels 45a and 45b into the recess 43 forcing the hold down cylinder 21 upwards to its original or home position. As the upper surface 54 of the hold down cylinder 21 approaches the upper bearing 24, the air is compressed in the recess 44 of the upper bearing 24 and forced out through the channels 46a and 46b into the groove 48 connected to port 30. Because the channels 46a and 46b constricts the air flow from recess 44 a controlled deacceleration is again applied to the hold down cylinder 21 such that jarring or sudden movement of the mechanism is prevented. In this way sudden shocks or impacts to or disturbance of the chip 19a on the piston 22 is eliminated. Simultaneously with the application of the 30 psi air to the lower port 31 the needle 33 is retracted and moves back into its home position within the needle housing 16 and below the surface of the adhesive tape 18. As indicated in FIG. 6 the hold down cylinder 21 once again is retracted up to its full extent so that the end of the piston 22 holding the chip 19a is exposed.

The spider assembly 13 can now be indexed to bring the pencil assembly to an unloading station (not shown). Once the chip is unloaded by applying air to the port 28 to break the vacuum holding the chip on the lower end of the piston 22, the pencil assembly may be returned over the head 34 and the fractured wafer indexed so that a new and different chip is positioned below the piston 22 and the sequence repeated.

In the actual apparatus the mats 36 and 42 on the faces of the piston 22 and the hold down cylinder 21 respectively were formed of rubber of 30–40 durometers, the needle 33 had a point radius of between 0.001 and 0.005 inches and was formed of tungsten carbide and was forced against the chip with a force of between 90 and 100 gms. Also the needle housing head 34 as shown in FIG. 7 had each side face 34b of at an angle with respect to the top face 34a. This angle will change depending on the size of the dice. For example when the dice were 0.160 inches square this angle with the top horizontal face was 9° and when the dice was 0.190 inches square this angle was 4.5°.

Thus there has been described a sensitive low contact mass pick up pencil for fragile devices which is fluid activated and which has a low impact mass and a controlled deacceleration to the moving contact element to cause the moving contact element to be substantially zero as it contacts the devices. It should be understood that although the invention has been described in connection with specific pulses, forces, and time sequences that other forces and time sequences may be used without deviating from the present invention.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. In an apparatus for contacting a fragile device comprising,
   means for supporting said fragile device in a predetermined position,
   a contact element containing a pick up pencil and,
   means for moving said contact element toward said device, said moving means including fluid means for providing a controlled deacceleration to said contact element to cause the motion of the element toward the device to be substantially zero as the element comes in contact with the device,
   said fluid means including a chamber having an opening to exhaust the fluid out of the apparatus and reduce the pressure on said fluid to atmospheric pressure.

2. In an apparatus for contacting a fragile device as set forth in claim 1 wherein,
   said fluid means further includes a chamber having a plurality of openings through which said fluid is forced out of the apparatus at a controlled rate.

3. The apparatus of claim 1 wherein said contact element comprises a hold down cylinder adjacent to said pick up pencil.

4. The apparatus of cliam 3 wherein said supporting means contains a needle extendable therefrom and towards said contact element.

5. The apparatus of claim 4 wherein said needle is comprised of tungsten carbide and has a point radius of between 0.001 inches and 0.005 inches.

6. The apparatus of claim 4 wherein said fragile device comprises a semiconductor wafer fractured into a plurality of individual dice and said supporting means comprises a contoured head for supporting a selected dice in a preferred position over said needle and under said pencil and for supporting each of said dice adjacent to said selected device.

7. The apparatus of claim 6 wherein said hold down cylinder is contoured to mate with said contoured head and to positively hold said adjacent devices on said head.

8. The apparatus of claim 6 wherein said pencil is provided with fluid means to force said pencil against said selected dice with a predetermined pressure when said element comes into contact with fragile device.

9. The apparatus of claim 8 wherein said pencil is further provided with vacuum means for positively holding said selected dice against said pencil.

10. Pick up apparatus for semiconductor dice comprising,
   a sheet of adhesive material to which a plurality of dice is adhered,
   a needle assembly having an extendable needle and a contoured head, through which said needle can pass, for supporting a selected one of said dice in a preferred position over said needle, and
   a pick up head comprising a housing,
   upper and lower bearings in said housing,
   a hold down cylinder supported in said bearings and having a constrained bidirectional path, and
   a pencil in said hold down cylinder,
   each of said bearings being provided with means for providing a controlled deacceleration to said hold down cylinder as it approaches either end of said constrained path.

11. The apparatus of cliam 10 wherein said pencil is supported in the center of said cylinder by a bearing positioned in a bearing housing, supported on said upper bearing, and capped by a manifold,
   said manifold being provided with means for applying a constant force to said pencil, and
   said means for providing a controlled deacceleration to the hold down cylinder comprises in each of said bearings a recess and channel means connecting said recess with ports in said housing.

12. The apparatus of claim 11 wherein said hold down cylinder is provided with a seal bearing between said upper bearing and said lower bearing to bisect the interior of said housing and
   said hold down cylinder and said pencil are both provided with compressable mats.

13. The apparatus of claim 11 wherein said constant force is about 75 grms.

14. The apparatus of claim 12 wherein said mats on said hold down cylinder is contoured to mate with said contoured head on said needle assembly.

15. The apparatus of claim 11 wherein said contoured head is maintained a fixed distance from said pick up head, and said path length is sufficient to cause said hold down cylinder to positively hold down said sheet on said head held at said fixed distance and said needle extends from said housing a distance sufficient to remove said selected one of said dice from said sheet.

* * * * *